(12) United States Patent
Patel et al.

(10) Patent No.: US 10,811,069 B2
(45) Date of Patent: Oct. 20, 2020

(54) NON-VOLATILE MEMORY ELEMENTS WITH MULTIPLE ACCESS TRANSISTORS

(71) Applicant: GLOBALFOUNDRIES Inc., Grand Cayman (KY)

(72) Inventors: Harsh N. Patel, Clifton Park, NY (US); Bipul C. Paul, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/248,279

(22) Filed: Jan. 15, 2019

(65) Prior Publication Data
US 2020/0227107 A1 Jul. 16, 2020

(51) Int. Cl.
| | |
|---|---|
| G11C 11/16 | (2006.01) |
| G11C 13/00 | (2006.01) |
| H01L 27/092 | (2006.01) |
| H01L 27/22 | (2006.01) |
| H01L 27/24 | (2006.01) |
| H01L 23/528 | (2006.01) |
| H01L 29/423 | (2006.01) |
| H01L 21/8238 | (2006.01) |

(Continued)

(52) U.S. Cl.
CPC ...... *G11C 11/1657* (2013.01); *G11C 11/1655* (2013.01); *G11C 11/1675* (2013.01); *G11C 13/0026* (2013.01); *G11C 13/0028* (2013.01); *G11C 13/0069* (2013.01); *H01L 21/823871* (2013.01); *H01L 23/5286* (2013.01); *H01L 27/0924* (2013.01); *H01L 27/222* (2013.01); *H01L 27/2463* (2013.01); *H01L 29/42392* (2013.01); *G11C 2013/009* (2013.01); *H01F 10/329* (2013.01); *H01F 10/3254* (2013.01); *H01L 43/02* (2013.01)

(58) Field of Classification Search
CPC ............ G11C 11/1657; G11C 11/1655; G11C 11/1675
USPC ......................................... 365/158, 171, 173
See application file for complete search history.

(56) References Cited

U.S. PATENT DOCUMENTS

| | | | |
|---|---|---|---|
| 9,396,782 B2 | 7/2016 | Alvarez-Hrault et al. | |
| 9,542,989 B2 | 1/2017 | Gogl et al. | |
| 9,577,009 B1 | 2/2017 | Shih et al. | |

(Continued)

OTHER PUBLICATIONS

Harsh N. Patel et al., "Dynamic Bipolar Write-Assist for Non-Volatile Memory Elements", U.S. Appl. No. 16/205,921, filed Nov. 30, 2018.

(Continued)

*Primary Examiner* — Han Yang
(74) *Attorney, Agent, or Firm* — Thompson Hine LLP

(57) ABSTRACT

Structures for a non-volatile memory and methods for forming and using such structures. The structure includes a bitcell having a non-volatile memory element and a transmission gate. The transmission gate includes an n-type field-effect transistor and a p-type field effect transistor. The n-type field-effect transistor has a first drain region, a first source region, and a first gate electrode. The p-type field-effect transistor has a second drain region, a second source region coupled in parallel with the first source region, and a second gate electrode. The first drain region of the n-type field-effect transistor and the second drain region of the p-type field-effect transistor are coupled in parallel with the non-volatile memory element.

18 Claims, 3 Drawing Sheets

(51) Int. Cl.
*H01L 43/02* (2006.01)
*H01F 10/32* (2006.01)

(56) References Cited

U.S. PATENT DOCUMENTS

| | | |
|---|---|---|
| 9,842,638 B1 | 9/2017 | Li et al. |
| 9,786,343 B1 | 10/2017 | DeBrosse |
| 9,934,853 B2 | 4/2018 | Yang et al. |
| 2010/0008134 A1* | 1/2010 | Chen ............... G11C 11/16 365/171 |
| 2013/0028010 A1* | 1/2013 | Li ............... G11C 11/1659 365/158 |
| 2014/0063922 A1 | 3/2014 | Kim et al. |
| 2018/0122467 A1* | 5/2018 | Pyo ............... G11C 13/0069 |

OTHER PUBLICATIONS

Nebashi et al., "A 90nm 12ns 32Mb 2T1MTJ MRAM", 2009 IEEE International Solid-State Circuits Conference.

Sakimura et al., "A 250-MHz 1-Mbit Embedded MRAM Macro Using 2T1MTJ Cell with Bitline Separation and Half-Pitch Shift Architecture", IEEE Asian Solid-State Circuits Conference Nov. 12-14, 2007 / Jeju, Korea.

* cited by examiner

NON-VOLATILE MEMORY ELEMENTS WITH MULTIPLE ACCESS TRANSISTORS

BACKGROUND

The present invention relates to integrated circuits and semiconductor device fabrication and, more specifically, to structures for a non-volatile memory and methods for forming and using such structures.

A magnetic random access memory (MRAM) device provides an embedded non-volatile memory technology in which the memory elements operate based on principles of magnetoresistance. Because the memory elements of the MRAM device are non-volatile, the stored data is retained when the memory elements are not powered.

In an MRAM bitcell, data is stored by a magnetoresistive memory element that includes a pinned layer and a free layer, each of which holds a magnetization. The magnetization of the pinned layer is fixed in its magnetic orientation, and the magnetization of the free layer can be changed by an external magnetic field generated by a programming current. In particular, the external magnetic field can cause the magnetic orientations of the magnetic layers to either be parallel, providing a low electrical resistance across the layers ("0" state), or antiparallel, providing a high electrical resistance across the layers ("1" state). The switching of the magnetic orientation of the free layer and the resulting high or low resistance states across the magnetic layers provide for the write and read operations of the MRAM bitcell.

A non-volatile memory includes multiple active MRAM bitcells that are arranged in an array of rows and columns. Each active bitcell in the array includes a field-effect transistor that controls access to the memory element for reading and writing data. A word line is connected to the gates of the field-effect transistors in each row of the array. The word line may be used to select the field-effect transistors in a row of active bitcells for data read and write operations to the related memory elements.

Conventional MRAM bitcells require multiple power rails in order to control read and write operations. For example, a positive gate voltage is required during write operations to switch the magnetic orientation of the free layer from parallel alignment to antiparallel alignment with the magnetic orientation of the fixed layer, and a different positive gate voltage is required during write operations to switch the magnetic orientation of the free layer from antiparallel alignment to parallel alignment with the magnetic orientation of the fixed layer. In addition to these deficiencies, the gate of the field-effect transistor must be overdriven during write operations, which may cause reliability issues. In addition, a positive voltage is supplied to either the bit line or the source line depending on the specific write operation. One approach for providing the needed power rails is to provide multiple regulated supply rails. However, this approach results in power efficiency loss in voltage regulators and increased design complexity. Another approach for providing the needed power rails is to provide internally-generated supply rails. However, this approach incurs a large area penalty.

Improved structures for a non-volatile memory and methods for forming and using such structures are needed.

SUMMARY

According to an embodiment of the invention, a memory structure includes a bitcell having a non-volatile memory element and a transmission gate. The transmission gate includes an n-type field-effect transistor and a p-type field effect transistor. The n-type field-effect transistor has a first drain region, a first source region, and a first gate electrode. The p-type field-effect transistor has a second drain region, a second source region coupled in parallel with the first source region, and a second gate electrode. The first drain region of the n-type field-effect transistor and the second drain region of the p-type field-effect transistor are coupled in parallel with the non-volatile memory element.

According to another embodiment of the invention, a method is provided for forming a bitcell. The method includes forming an n-type field-effect transistor having a first drain region, a first source region, and a first gate electrode, and forming a p-type field-effect transistor having a second drain region, a second source region, and a second gate electrode. The method further includes forming an interconnect structure including a non-volatile memory element, a first interconnect path coupling the first drain region of the n-type field-effect transistor in parallel with the second drain region of the p-type field-effect transistor in parallel, and a second interconnect path coupling the first source region of the n-type field-effect transistor in parallel with the second source region of the p-type field-effect transistor. The first interconnect path is connected within the interconnect structure with the non-volatile memory element.

According to another embodiment of the invention, a method includes operating a p-type field-effect transistor and an n-type field-effect transistor of a transmission gate to provide a programming current to a non-volatile memory element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
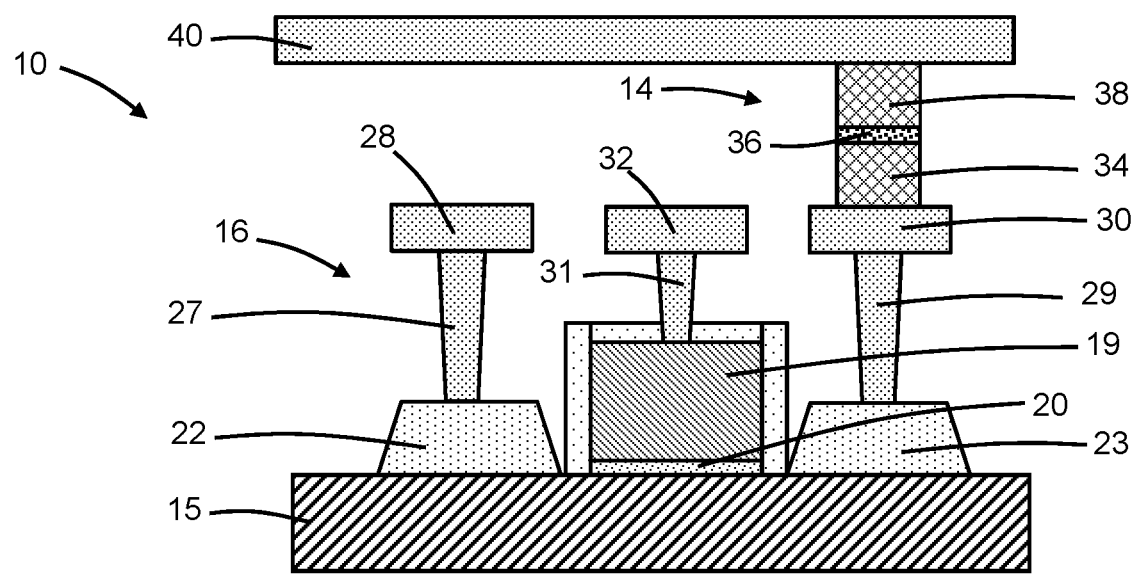
FIG. 1 is a diagrammatic cross-sectional view of a non-volatile memory element and a field-effect transistor of a bitcell in accordance with embodiments of the invention.
Figure 1A:
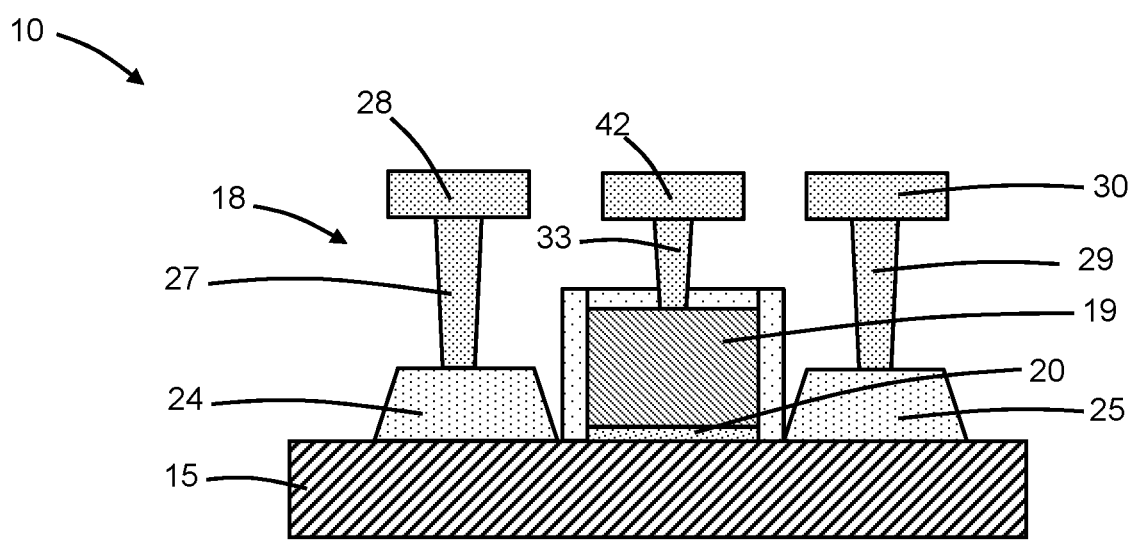
FIG. 1A is a diagrammatic cross-sectional view of another field-effect transistor included in the bitcell of FIG. 1.

With reference to FIGS. 1, 1A and in accordance with embodiments of the invention, a bitcell 10 for a magnetic random access memory (MRAM) includes a transmission gate 12 and a magnetic tunneling junction (MTJ) memory element 14 as a representative non-volatile memory element that is coupled with the transmission gate 12. The transmission gate 12 includes field-effect transistors 16, 18 that may be formed by front-end-of-line (FEOL) processing using a substrate 15 that may be composed of a single-crystal semiconductor material, such as single-crystal silicon. In an embodiment, each of the field-effect transistors 16, 18 may include a gate structure having a gate electrode 19 and a gate dielectric 20. The gate electrode 19 may be composed of a conductor, such as doped polycrystalline silicon (i.e., doped polysilicon), and the gate dielectric 20 may be composed of an electrical insulator, such as silicon dioxide. Alternatively, the gate electrode 19 may include one or more conformal barrier metal layers and/or work function metal layers, such as metal layers composed of titanium aluminum carbide and/or titanium nitride, and a metal gate fill layer composed of a conductor, such as tungsten, and the gate dielectric 20 may be composed of a high-k dielectric material, such as hafnium oxide.

The field-effect transistor 16 of the transmission gate 12 may be an n-type field-effect transistor (NFET) that includes a source region 22 and a drain region 23 composed of a semiconductor material (e.g., silicon) grown by an epitaxial growth process and that may be doped to contain an n-type dopant (e.g., arsenic and/or phosphorus) providing n-type conductivity. The field-effect transistor 18 of the transmission gate 12 may be a p-type field-effect transistor (PFET) that includes a source region 24 and a drain region 25 composed of a semiconductor material (e.g., silicon-germanium) grown by an epitaxial growth process and that may be doped to contain a p-type dopant (e.g., boron) providing n-type conductivity.

In the representative embodiment, the field-effect transistors 16, 18 are planar field-effect transistors. In an alternative embodiment, the field-effect transistors 16, 18 may be fin-type field-effect transistors each formed using one or more semiconductor fins, and the respective gate structure may overlap with and wrap about the sides of the one or more semiconductor fins with the gate dielectric 20 arranged between the gate electrode 19 and the sides of the fins. In an alternative embodiment, the field-effect transistors 16, 18 may be gate-all-around field-effect transistor in which semiconductor channel layers are arranged in a layer stack and the gate electrode 19 is wrapped about all sides of each semiconductor channel layer.

An interconnect structure may be formed by middle-of-line (MOL) processing and/or back-end-of-line (BEOL) processing over the transmission gate 12 after FEOL processing is completed. Conductive features in one or more metallization levels of the interconnect structure are connected to provide interconnect paths connecting the MTJ memory element 14 with the field-effect transistors 16, 18 of the transmission gate 12, and the MTJ memory element 14 is formed in one or more of the metallization levels. Specifically, the interconnect structure includes a source line 28 coupled in an interconnect path by contacts 27 with the source regions 22, 24 of the field-effect transistors 16, 18, a pad 30 coupled by contacts 29 in an interconnect path with the drain regions 23, 25 of the field-effect transistors 16, 18, a word line 32 coupled in an interconnect path by a contact 31 with the gate electrode 19 of the field-effect transistor 16, a complementary word line 42 coupled in an interconnect path by a contact 33 with the gate electrode 19 of the field-effect transistor 18, and a bit line 40 coupled in an interconnect path with the MTJ memory element 14. The contacts 27, 29, 31, 33, source line 28, pad 30, word line 32, complementary word line 42, and bit line 40 are embedded in one or more dielectric layers (not shown) as conductive features of the interconnect structure. The one or more dielectric layers may be comprised of an electrically-insulating dielectric material, such as an oxide of silicon (e.g., silicon dioxide) deposited by chemical vapor deposition. The contacts 27, 29, 31, 33 may be comprised of a conductor, such as a metal like tungsten or cobalt, and may be clad by a conductive barrier/liner layer (not shown). The source line 28, pad 30, word line 32, bit line 40, and complementary word line 42 may be comprised of a conductor, such as copper or cobalt, formed by a damascene process.

The MTJ memory element 14 and the field-effect transistors 16, 18 provide a two transistor-one memory element bitcell design. The MTJ memory element 14 is located in the interconnect structure over the pad 30. The MTJ memory element 14 includes a pinned or fixed layer 34, a tunnel barrier layer 36, and a free layer 38. The fixed layer 34 may be a layer stack that includes one or more magnetic layers composed of, for example, a cobalt-iron-boron alloy or a cobalt-iron alloy deposited by physical vapor deposition. The magnetization of the fixed layer 34 is pinned such that the magnetization cannot flip (i.e., rotate) in the presence of an applied magnetic field and thereby acts as a fixed reference. The tunnel barrier layer 36 may be composed of a non-magnetic and electrically insulating layer, such as magnesium oxide or aluminum oxide. The free layer 38 may also be composed of an alloy magnetic layer or a multilayer that includes one or more layers of, for example, a cobalt-iron-boron alloy or a cobalt-iron) alloy, or a nickel-iron alloy. The MTJ memory element 14 may also include top and/or bottom electrodes (not shown) comprised of a conductive material, such as tantalum or tantalum nitride.

The magnetization or magnetic orientation of the fixed layer 34 is pinned or fixed to a particular direction while the magnetization or magnetic orientation of the free layer 38 may be switched based on an applied current density and direction of a programming current supplied by applied bias voltages. In particular, the magnetization of the free layer 38 may be switched by a programming current to be aligned in a direction parallel to the magnetization of the fixed layer 34, or switched by a programming current to be aligned in a direction antiparallel to the magnetization the fixed layer 34, depending on a direction of the programming current supplied to the MTJ memory element 14. Because of increased tunneling across the tunnel barrier layer 36 in the parallel state, the electrical resistance across the tunnel barrier layer 36 between the free layer 38 and the fixed layer 34 in the parallel state is less than the electrical resistance across the tunnel barrier layer 36 between the free layer 38 and the fixed layer 34 in the antiparallel state. The comparatively low and high electrical resistance states of the MTJ memory element 14 define two distinct memory states capable of storing binary data.

The MTJ memory element 14 relies on principles of spin transfer torque to effectuate a change in the direction of magnetization of the free layer 38 that provides the two distinct memory states. To that end, the transmission gate 12 causes a spin-polarized programming current to flow vertically through the MTJ memory element 14. When electrons of the programming current flow across the MTJ memory element 14 in a direction from the fixed layer 34 to the free layer 38, spin torque from these electrons orientates the magnetization of the free layer 38 in a direction that is parallel to the magnetization of the fixed layer 34. When electrons of the programming current flow across the MTJ memory element 14 in a direction from the free layer 38 to the fixed layer 34, spin torque from electrons that are reflected from the fixed layer 34 back into the free layer 38 orientates the magnetization of the free layer 38 to be anti-parallel relative to the magnetization of the fixed layer 34. Thus, controlling the direction of the electron (current) flow causes switching of the direction of magnetization of the free layer 38 relative to the fixed layer 34, and the associated resistance changes between low and high states based on the magnetization of the free layer 38, i.e. parallel versus anti-parallel, relative to that of the fixed layer 34. The switch in the magnetization direction of the free layer 38 may be used to write different data states to the MTJ memory element 14 of the bitcell 10.

The transmission gate 12 and MTJ memory element 14 of the bitcell 10 may be arranged in rows and columns with other similar bitcells 10 to define a non-volatile memory array for a memory device. The source line 28 and bit line 40 associated with each column in the non-volatile memory array participate in providing a bi-directional current path for reading and writing data values to one or more bitcells 10 of the column under the control of the transmission gates 12 contained in the bitcells 10. The word line 32 and complementary word line 42 are coupled to the gate electrodes 19 of the field-effect transistors 16, 18 in a particular row of bitcells 10 to enable the bitcells 10 in that particular row to be selected for data read and write operations.

A digital control circuit 35 (FIG. 2) is used to apply different control voltages to the word line 32 and complementary word line 42 to switch the field-effect transistors 16, 18 of the transmission gate 12 to write data to the MTJ memory element 14 of the bitcell 10. In an embodiment, the control voltages may be selected from a positive bias voltage and ground (i.e., zero (0) volts). In an embodiment, the control voltages may be a regulated bias voltage supplied from a positive power supply ($V_{DD}$) rail, and a regulated bias voltage supplied from a negative power supply ($V_{SS}$) rail. The specific control voltage supplied from the word line 32 to the gate electrode 19 of the field-effect transistor 16 and the specific control voltage supplied from the complementary word line 42 to the gate electrode 19 of the field-effect transistor 18 are switched under the control of the digital control circuit 35. In an embodiment, the digital control circuit 35 may include an inverter between the gate electrodes 19 of the field-effect transistors 16, 18 to provide the two complementary control voltages. When the control voltage is logic zero ('low"), both of the field-effect transistors 16, 18 are cut-off and the transmission gate 12 is 'OFF' or open. When the control voltage is logic one ('high"), both of the field-effect transistors 16, 18 are biased into conduction and the transmission gate 12 is 'ON' or closed to conduct a programming current.

In an alternative embodiment, the bitcell 10 may include a resistive memory element, instead of the MTJ memory element 14, as a non-volatile memory element, and may be included in a resistive random access memory (ReRAM) array. Data is stored in the resistive memory element by changing the resistance across a layer containing a dielectric material to provide different states. The dielectric material, which is normally insulating, can be made to conduct through one or more filaments or conductive paths generated by applying a sufficiently high voltage. The resistive memory element of the bitcell 10 switches between the insulating and conducting phases by creating or destroying the filament(s) to provide a "0" state or a "1" state.

Figure 2:
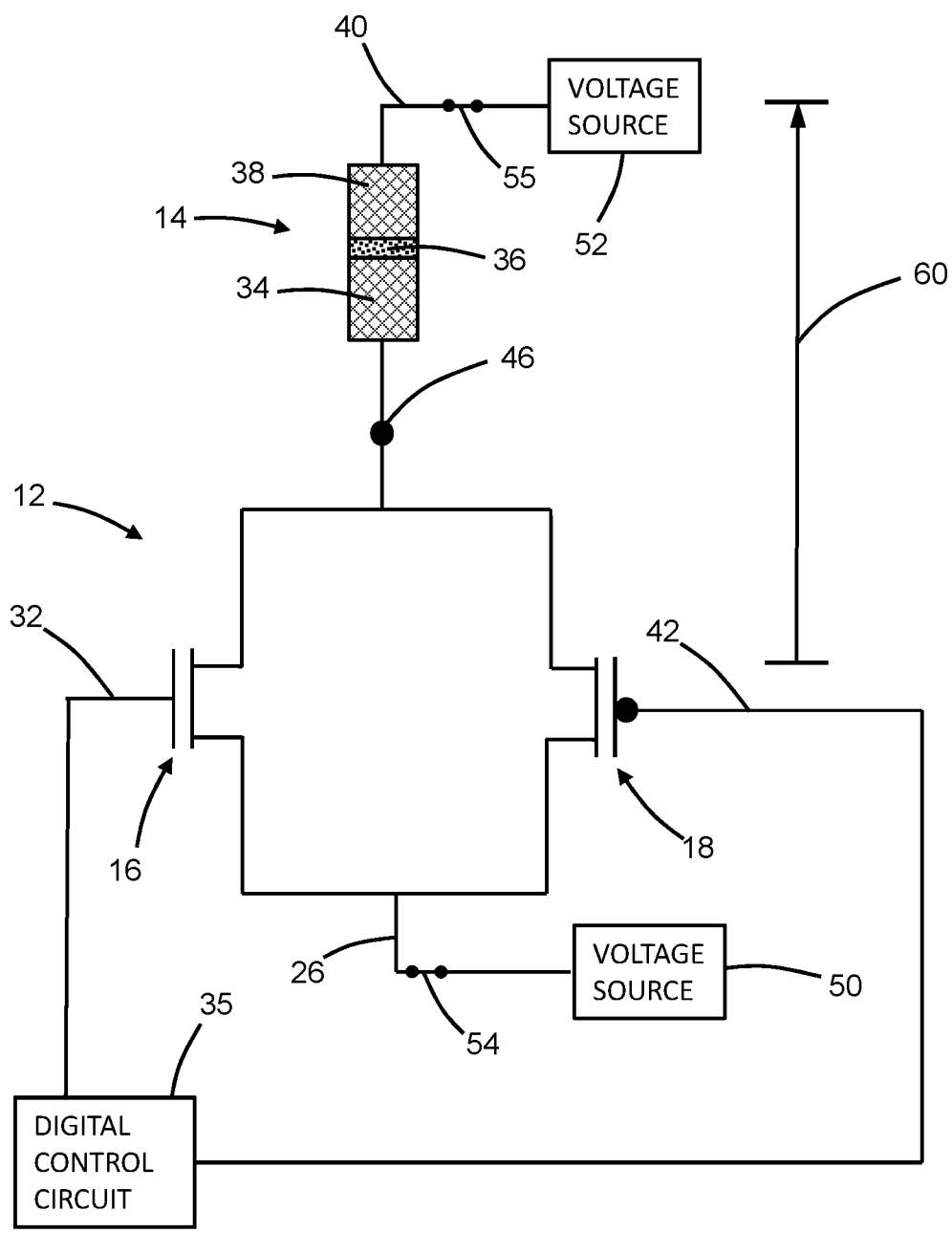
FIG. 2 is a circuit diagram of the bitcell under biasing to produce a transition from a parallel state to an antiparallel state.

With continued reference to FIGS. 1, 1A and 2, a biasing scheme is described for a write operation with antiparallel-to-parallel switching that causes the free layer 38 in the bitcell 10 to change or switch from an antiparallel state relative to the fixed layer 34 to a parallel state relative to the fixed layer 34. The magnetization of the fixed layer 34 and the magnetization of the free layer 38 are in an antiparallel state before the write operation, and the magnetization of the fixed layer 34 and the magnetization of the free layer 38 are in a parallel state following the write operation.

The bit line 40 is connected with a voltage source 52 to provide a positive bias voltage to the bit line 40. In an embodiment, the bit line 40 may be connected with the voltage source 52 by closing a switch 55. The source line 28 is connected with a voltage source 50 to provide a bias voltage equal to ground to the source line 28. In an embodiment, the source line 28 may be connected with the voltage source 50 by closing a switch 54. The switches 56, 57 (FIG. 3) are opened, and all of the switches 54, 55, 56, 57 may be embedded in a memory controller (not shown). The digital control circuit 35 supplies a voltage level corresponding to a logic 1 (i.e., a binary high value) to the word line 32 and a voltage level corresponding to logic 0 (i.e., a binary low value) to the complementary word line 42. The field-effect transistor 16 is turned 'OFF' and the field-effect transistor 18 is turned 'ON', which causes a programming current 60 to flow from the source line 28 to the bit line 40 and across the MTJ memory element 14 in a direction from the fixed layer 34 to the free layer 38. In an embodiment, the voltage level supplied to the word line 32 may be equal to the positive bias voltage supplied to the bit line 40.

The voltage level supplied from the word line 32 to the field-effect transistor 16 to provide the antiparallel-to-parallel state change is less than in conventional biasing schemes, which overdrive the access transistor in order to provide the state change. The lowered word line voltage may improve reliability during operation and the power budget for operation. The bias voltage appearing at an internal node 46 of the circuit is significantly higher than in conventional biasing schemes despite the lowered voltage level supplied from the word line 32 to the field-effect transistor 16. The biasing is sufficient to provide the programming current 60 between the source line 28 and bit line 40 that exceeds a threshold for producing the state change in magnetization from antiparallel to parallel and that may be greater than the programming current generated in conventional biasing schemes that require a higher word line voltage to overdrive the access transistor.

Figure 3:
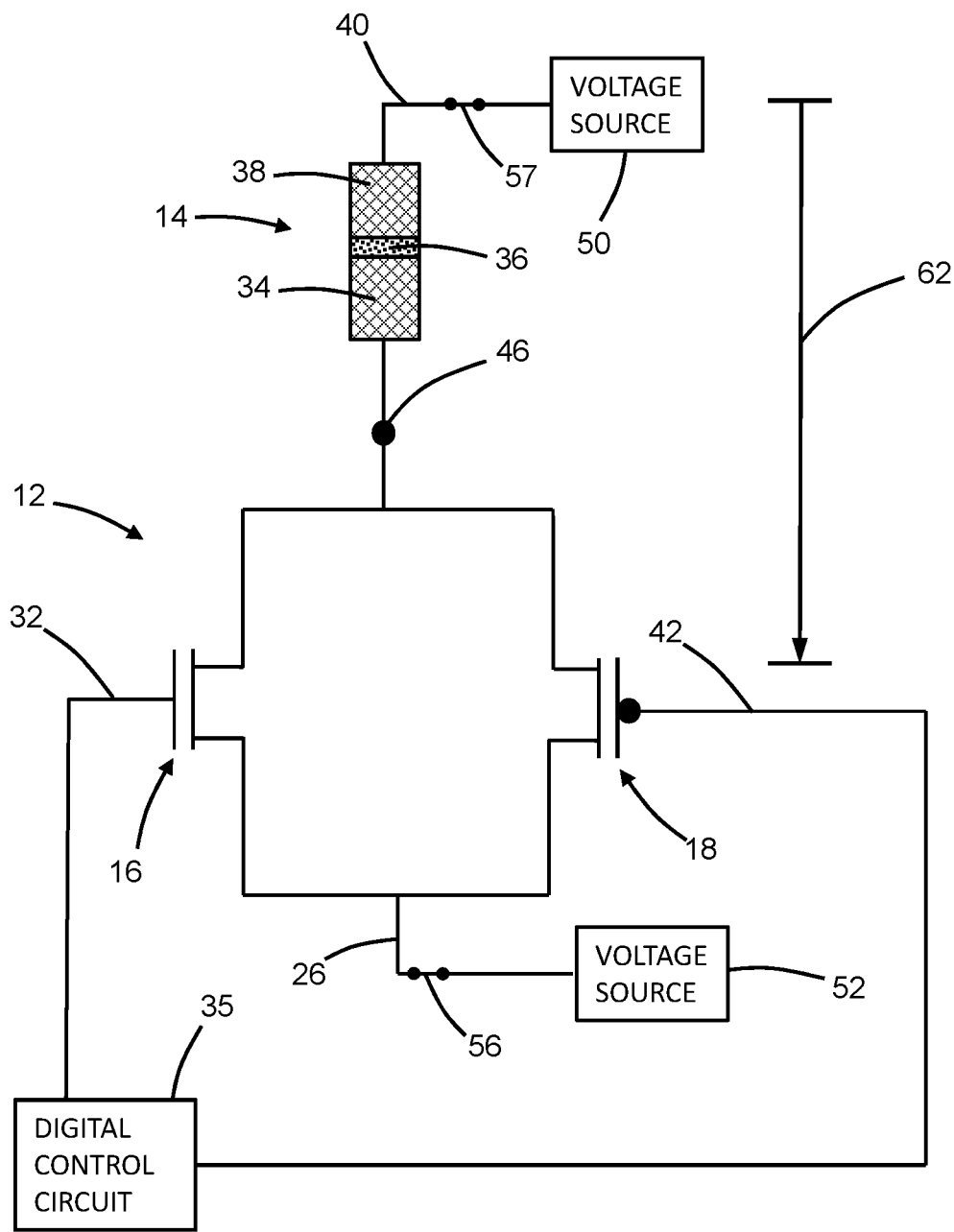
FIG. 3 is a circuit diagram of the bitcell under biasing to produce a transition from an antiparallel state to a parallel state.

With reference to FIGS. 1, 1A, and 3, a biasing scheme is described for a write operation with parallel-to-antiparallel switching that causes the free layer 38 in the bitcell 10 to change or switch from a parallel state relative to the fixed layer 34 to an antiparallel state relative to the fixed layer 34. The magnetization of the fixed layer 34 and the magnetization of the free layer 38 are in a parallel state before the write operation, and the magnetization of the fixed layer 34 and the magnetization of the free layer 38 are in an antiparallel state following the write operation.

The source line 28 is connected with the voltage source 52 to provide a positive bias voltage to the source line 28. In an embodiment, the source line 28 may be connected with the voltage source 52 by closing a switch 56. The bit line 40 is connected with the voltage source 50 to provide a bias voltage equal to ground to the bit line 40. In an embodiment, the bit line 40 may be connected with the voltage source 50 by closing a switch 57. The switches 54, 55 (FIG. 2) are opened. The digital control circuit 35 supplies a voltage level corresponding to a logic 1 (i.e., a binary high value) to the complementary word line 42 and a voltage level corresponding to logic 0 (i.e., a binary low value) to the word line 32. The field-effect transistor 16 is turned 'OFF' and the field-effect transistor 18 is turned 'ON', which causes a programming current 62 to flow from the bit line 40 to the source line 28 and across the MTJ memory element 14 in a direction from the free layer 38 to the fixed layer 34. In an embodiment, the voltage level supplied to the word line 32 may be equal to the positive bias voltage supplied to the source line 28.

The voltage level supplied from the word line 32 to the field-effect transistor 16 to provide the parallel-to-antiparallel state change is less than in conventional biasing schemes, which overdrive the access transistor in order to provide the memory state change and, in particular, during antiparallel-to-parallel switching. The lowered word line voltage may improve reliability during operation and the power budget for operation. The biasing is sufficient to provide the programming current 62 between the source line 28 and bit line 40 that exceeds a threshold for producing the state change in magnetization from parallel to antiparallel and that may be greater than or equal to the programming current required in conventional biasing schemes that require a higher word line voltage to overdrive the access transistor.

The embodiments of the bitcell 10 and the bipolar biasing schemes applied during the different write operations permit the number of power supply rails supplying positive bias voltages to be reduced from three to one. Specifically, conventional biasing schemes require three regulated positive bias voltage sources for write operations, whereas the embodiments of the bitcell 10 and the biasing scheme applied during write operations require only a single regulated positive bias voltage source.

The effective resistance presented by the field-effect transistors 16, 18, when arranged in parallel in the transmission gate 12, is less than the resistance of conventional two-transistor arrangements in which the complementary field-effect transistors are connected in series between the supply rails, one of the field-effect transistors provides the programming current to the MRAM memory element in one direction, and the other of the field-effect transistors provides the programming current to the MRAM memory element in the opposite direction. In addition, the transmission gate 12 occupies a smaller area due to the parallel connection that conventional field-effect transistors connected in series.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory structure comprising:
a bitcell including a non-volatile memory element and a transmission gate having an n-type field-effect transistor and a p-type field-effect transistor, the n-type field-effect transistor having a first drain region, a first source region, and a first gate electrode, the p-type field-effect transistor having a second drain region, a second source region coupled in parallel with the first source region, and a second gate electrode, and the first drain region of the n-type field-effect transistor and the second drain region of the p-type field-effect transistor coupled in parallel with the non-volatile memory element;
a bit line coupled with the non-volatile memory element;
a word line coupled with the first gate electrode of the n-type field-effect transistor;
a voltage source coupled to the bit line, the voltage source configured to supply a first positive bias voltage to the bit line; and
a digital control circuit coupled with the word line, the digital control circuit configured to supply a first voltage level to the word line,
wherein the first voltage level supplied by the digital control circuit to the word line is equal to the first positive bias voltage supplied by the voltage source to the bit line.

2. The memory structure of claim 1 wherein the non-volatile memory element of the bitcell is a magnetoresistive random access memory (MRAM) element.

3. The memory structure of claim 1 wherein the non-volatile memory element of the bitcell is a resistive random access memory (ReRAM) element.

4. The memory structure of claim 1 further comprising:
a complementary word line coupled with the second gate electrode of the p-type field-effect transistor.

5. The memory structure of claim 4 wherein the digital control circuit is further coupled with the complementary word line, and the digital control circuit is configured to concurrently supply the first voltage level to the word line and a second voltage level to the complementary word line in order to operate the transmission gate to perform write operations to the non-volatile memory element.

6. The memory structure of claim 5 further comprising:
a source line coupled with the first source region of the n-type field-effect transistor and with the second source region of the p-type field-effect transistor,
wherein, in response to the first voltage level supplied to the word line and the second voltage level supplied to the complementary word line, the bit line and the source line are configured to be biased to provide a first programming current for writing data to the non-volatile memory element to provide a first memory state and to provide a second programming current for writing data to the non-volatile memory element to provide a second memory state.

7. The memory structure of claim 6 wherein the voltage source is configured to bias the bit line with the first positive bias voltage to provide the first programming current, and the voltage source is configured to bias the source line with a second positive bias voltage to provide the second programming current.

8. The memory structure of claim 7 further comprising:
a positive power supply rail,
wherein the digital control circuit is configured to couple the first gate electrode of the n-type field-effect transistor with the positive power supply rail to provide the first voltage level.

9. The memory structure of claim 1 wherein the voltage source is a single regulated positive bias voltage source.

10. The memory structure of claim 1 further comprising:
a source line coupled with the first source region of the n-type field-effect transistor and with the second source region of the p-type field-effect transistor,
wherein the bit line and the source line are configured to be biased to provide a first programming current for writing data to the non-volatile memory element to provide a first memory state and to provide a second programming current for writing data to the non-volatile memory element to provide a second memory state.

11. The memory structure of claim 10 wherein the bit line is configured to be biased with the first positive bias voltage to provide the first programming current, and the source line is configured to be biased with a second positive bias voltage to provide the second programming current.

12. The memory structure of claim 11 further comprising:
a positive power supply rail,
wherein the positive power supply rail is configured to be selectively coupled with the bit line to provide the first positive bias voltage or with the source line to provide the second positive bias voltage.

13. The memory structure of claim 1 wherein the n-type field-effect transistor and the p-type field-effect transistor are planar field-effect transistors, fin-type field-effect transistors, or gate-all-around field-effect transistors.

14. The memory structure of claim 1 further comprising:
an interconnect structure arranged over the transmission gate,
wherein the non-volatile memory element is arranged in the interconnect structure.

15. A method comprising:
operating a p-type field-effect transistor and an n-type field-effect transistor of a transmission gate to provide a first programming current to a non-volatile memory element for writing data to the non-volatile memory element to provide a first memory state,
wherein a bit line is coupled with the non-volatile memory element, a word line is coupled with a first gate electrode of the n-type field-effect transistor, a voltage source is coupled to the bit line, and a digital control circuit is coupled with the word line, the voltage source is configured to supply a first positive bias voltage to the bit line, the digital control circuit is configured to supply a first voltage level to the word line, and the first voltage level supplied to the word line is equal to the first positive bias voltage supplied to the bit line.

16. The method of claim 15 further comprising:
operating the p-type field-effect transistor and the n-type field-effect transistor of the transmission gate to provide a second programming current to the non-volatile memory element for writing data to the non-volatile memory element to provide a second memory state.

17. The method of claim 16 wherein the p-type field-effect transistor includes a second gate electrode coupled with a complementary word line, and further comprising:
concurrently supplying the first voltage level through the word line to the first gate electrode of the n-type field-effect transistor and a second voltage level through the complementary word line to the second gate electrode of the p-type field-effect transistor to operate the p-type field-effect transistor and the n-type field-effect transistor of the transmission gate to provide the first programming current or the second programming current.

18. The method of claim 15 wherein the voltage source is a single regulated positive bias voltage source.

* * * * *